(12) United States Patent
Georgescu et al.

(10) Patent No.: US 8,599,618 B2
(45) Date of Patent: Dec. 3, 2013

(54) HIGH VOLTAGE TOLERANT ROW DRIVER

(75) Inventors: Bogdan I. Georgescu, Colorado Springs, CO (US); Ryan T. Hirose, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 181 days.

(21) Appl. No.: 13/339,755

(22) Filed: Dec. 29, 2011

(65) Prior Publication Data
US 2013/0170292 A1  Jul. 4, 2013

Related U.S. Application Data

(60) Provisional application No. 61/566,436, filed on Dec. 2, 2011.

(51) Int. Cl.
*G11C 11/34* (2006.01)
(52) U.S. Cl.
USPC ............ 365/185.18; 365/185.23; 365/185.27; 365/185.29

(58) Field of Classification Search
USPC .............. 365/185.18, 185.23, 185.27, 185.29
See application file for complete search history.

(56) References Cited

U.S. PATENT DOCUMENTS 6,914,815 B2 *  7/2005  Kamei et al. ............. 365/185.23
7,142,458 B2 * 11/2006  Inoue ....................... 365/185.23

* cited by examiner

*Primary Examiner* — Trong Phan

(57) ABSTRACT

A circuit is configured to supply a first gate voltage (PG1) at a first voltage bias (VP1) to a source of a first transistor providing an output (WLS), providing the first voltage bias (VP1) to a second transistor and supplying a second voltage bias (VN1) and a second gate voltage (NG1) to a third transistor, the second transistor coupled in series to the third transistor and in parallel with the first transistor, to supply a third voltage bias (VP2) and a third gate voltage (PG2) to a fourth transistor, and a fourth voltage bias (VN2) and a fourth gate voltage (NG2) to a fifth transistor, the fourth transistor coupled in series to the fifth transistor, and the fourth and fifth transistors coupled to a gate of the second transistor, and to provide a fifth voltage bias (VN3) to a line connecting the third transistor to the fifth transistor.

20 Claims, 9 Drawing Sheets

|      | ERASE   |           |           |
|------|---------|-----------|-----------|
|      | SEL ROW | DESEL ROW | DESEL SECT |
| WLS  | VNEG    | VPOS      | VPWR      |
| PG1  | VPOS    | VPWR      | 0         |
| PG2  | VPWR    | VPWR      | 0         |
| NG1  | 0       | VNEG      | 0         |
| NG2  | 0       | 0         | 0         |
| VP1  | VPOS    | VPOS      | VPWR      |
| VP2  | VPOS    | VPOS      | VPWR      |
| VN1  | VNEG    | VNEG      | 0         |
| VN2  | 0       | 0         | 0         |
| VN3  | VNEG    | VNEG      | VNEG      |

FIG. 5

|      | PROGRAM |  |  |
| --- | --- | --- | --- |
|      | SEL ROW | DESEL ROW | DESEL SECT |
| WLS  | VPOS | VNEG | 0 |
| PG1  | VPWR | VPOS | VPWR |
| PG2  | VPWR | VPWR | 0 |
| NG1  | VNEG | 0 | VPWR |
| NG2  | 0 | 0 | 0 |
| VP1  | VPOS | VPOS | VPWR |
| VP2  | VPOS | VPOS | VPWR |
| VN1  | VNEG | VNEG | 0 |
| VN2  | 0 | 0 | 0 |
| VN3  | VNEG | VNEG | 0 |

FIG. 6

|  | PROGRAM | | |
|---|---|---|---|
|  | SEL ROW | DESEL ROW | DESEL SECT |
| WLS | VMARG (0-2.5) | 0 | 0 |
| PG1 | 0 | VPOS (3V) | VPWR |
| PG2 | VPOS (3V) | 0 | 0 |
| NG1 | 0 | VPWR | VPWR |
| NG2 | VPWR | -VTP (-1.6) | 0 |
| VP1 | VMARG (0-2.5) | VMARG (0-2.5) | VPWR |
| VP2 | VPOS (3V) | VPOS (3V) | VPWR |
| VN1 | 0 | 0 | 0 |
| VN2 | -VTP/0V* | -VTP/0V* | 0 |
| VN3 | -VTP (-1.6) | -VTP (-1.6) | -VTP (-1.6) |
| * THE LEVEL DEPENDS ON MSB VALUE | | | |

FIG. 7

|  | NEGATIVE MARGIN READ | | |
| --- | --- | --- | --- |
|  | SEL ROW | DESEL ROW | DESEL SECT |
| WLS | VMARG (-2.5-0) | 0 | 0 |
| PG1 | VPWR | 0 | VPWR |
| PG2 | 0 | VPWR | VPWR |
| NG1 | VPWR | VNEG (-3) | VPWR |
| NG2 | VNEG (-3) | 0 | VPWR |
| VP1 | 0 | 0 | 0 |
| VP2 | VPWR | VPWR | VPWR |
| VN1 | VMARG (-2.5-0) | VMARG (-2.5-0) | 0 |
| VN2 | VNEG (-3) | VNEG (-3) | 0 |
| VN3 | VNEG (-3) | VNEG (-3) | VNEG (-3) |

FIG. 8

|  | READ ALL SECTORS AND ROWS |
| --- | --- |
| WLS | 0 |
| PG1 | VPWR |
| PG2 | 0 |
| NG1 | VPWR |
| NG2 | VPWR |
| VP1 | VPWR |
| VP2 | VPWR |
| VN1 | 0 |
| VN2 | 0 |
| VN3 | 0 |

FIG. 9

HIGH VOLTAGE TOLERANT ROW DRIVER

RELATED APPLICATIONS

This application claims the benefit of and priority to the U.S. Provisional Application No. 61/566,436 filed Dec. 2, 2011.

TECHNICAL FIELD

This disclosure relates to memory row drivers and, in particular, to non-volatile memory high voltage row drivers.

BACKGROUND

Programmable non-volatile memories (NVM) are useful in many applications because they retain stored information even when power is removed from the memory. There are many different types of programmable non-volatile memory including, but not limited to, programmable read only memory (PROM), electrically erasable ROM (EEPROM) and Flash memory. These memory types have several methods of charge storage including but not limited to placing charge on a Floating Gate or Silicon-Oxide-Nitride-Oxide-Silicon (SONOS) storage material or node.

Like other types of memory, programmable NVMs are usually constructed as an array of bit cells arranged in rows and columns. For programmable NVMs, high voltage signals are used to erase and write data to the memory cells of the non-volatile memory. These high voltage signals include voltages which are outside of a normal power supply range of the integrated circuit. For example, a high voltage signal for newer devices includes high voltage levels VPOS and VNEG (e.g., +4.7V and −3.6V), which are applied to SONOS devices for program and erase modes. The high voltage signals applied to the SONOS device is the sum of VPOS and VNEG, and thus, the voltage bias may reach up to 8.3V across the terminals.

As the interest for smaller and faster devices has increased, interest in SONOS device scale down has increased as well. However, the aforementioned high voltage signals used on devices with thicker gate oxides may cause stresses on the devices with thinner gate oxides. Although additional devices can be employed to mitigate such stresses, inclusion of such devices may increase costs and complicate circuit fabrication.

BRIEF DESCRIPTION OF THE DRAWINGS

The present disclosure is illustrated by way of example, and not by way of limitation, in the figures of the accompanying drawings.

FIG. 5 is a table depicting bias voltages that may be used for erasing SONOS memory cells, according to an embodiment.

FIG. 6 is a table depicting bias voltages that may be used for programming SONOS memory cells, according to an embodiment.

FIG. 7 is a table depicting bias voltages that may be used for positive margin mode reads of SONOS memory cells, according to an embodiment.

FIG. 8 is a table depicting bias voltages that may be used for negative margin mode reads of SONOS memory cells, according to an embodiment.

FIG. 9 is a table depicting bias voltages that may be used for reading SONOS memory cells, according to an embodiment.

DETAILED DESCRIPTION

Figure 1:
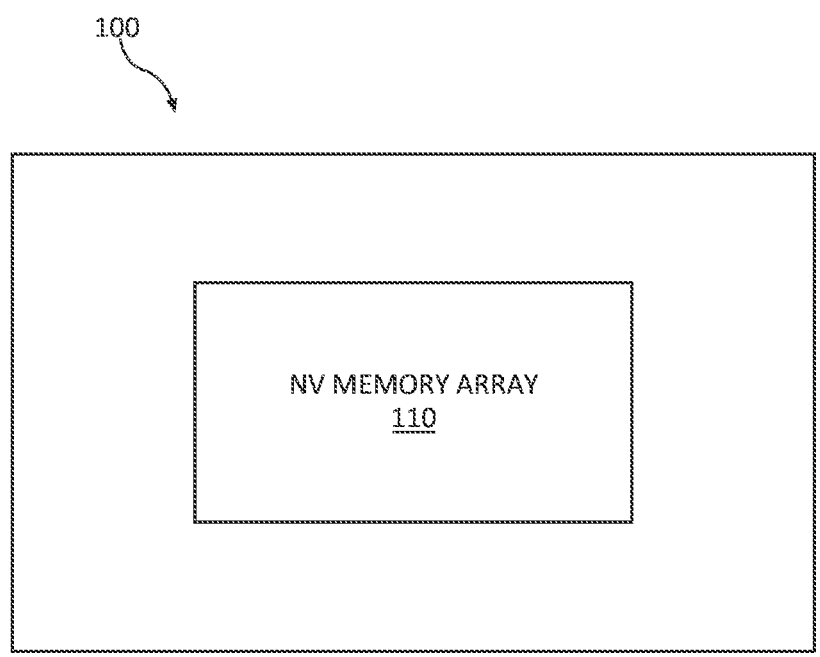
FIG. 1 is a block diagram depicting an embodiment of a non-volatile (NV) memory architecture.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with example embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Embodiments described herein include a row driver circuit that allows a word line SONOS (WLS) driver to operate in high voltage (HV) modes. In particular, the embodiments disclose generating additional bias voltages to correctly bias the p- and n-wells of various transistors and diffusion of the devices in the HV WLS, thereby allowing numerous voltage levels to be passed on the HV WLS as required in HV operation modes.

As part of the embodiments, the n-well, p-well, and supplies biases change significantly from mode to mode (e.g., between erase and program, from positive margin mode to negative margin mode, and the like) and from selected to de-selected rows. In order to achieve area savings when generating HV signals, the embodiments employ multiple levels of encoding the data corresponding to the HV biases. Specifically, some HV signals are global signals, sector based, or on pitch- or row based.

To accommodate the high voltage across the gate oxide and across the drain to source, extended drain devices are included in the circuit. Such devices include drains that are extended by a low-doped semiconductor region, which depletes during reverse biasing to thereby allow much of the voltage to be dropped across a channel and to reduce the electric field across a gate oxide to a safe level.

In an embodiment, the row driver circuit includes a first set of two transistors including a first transistor and a second transistor in series, a second set of two transistors in parallel with the first set of two transistors, the second set of two transistors including a third transistor and a fourth transistor in series, and a fifth transistor in parallel with the first set of two transistors. Each of the transistors receives a gate voltage and has bias voltages that are dependent on a mode in which the circuit is operating, as will be described in more detail below. The row driver circuit is included for use in a non-volatile memory architecture.

FIG. 1 is a block diagram depicting an embodiment of a non-volatile memory architecture 100. As shown in FIG. 1, the memory architecture includes an array 110 of programmable non-volatile memory cells and various circuits and components for controlling the manner in which the non-volatile memory cells are programmed, erased and read. Embodiments of the memory architecture will be described herein using SONOS devices developed, for example, in accordance with Cypress Semiconductor's 65 nm SONOS process technology. However, other embodiments are not so limited and may include substantially any type of memory cell developed in accordance with substantially any non-volatile process technology.

Figure 2A:
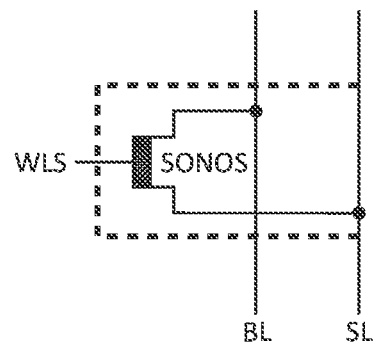
FIG. 2A is a circuit schematic depicting an embodiment of a 1T SONOS memory cell that may be included in the NV memory array of FIG. 1.

The non-volatile memory array 110 includes a plurality of memory cells arranged in rows and columns. Each memory cell may include one (1T) or two (2T) transistors. An embodiment of a 1T SONOS memory cell is illustrated in FIG. 2A. The 1T memory cell shown in FIG. 2A includes an N-type SONOS transistor having gate, drain, source and bulk terminals (see, FIG. 3). The gate of the SONOS transistor is coupled for receiving a SONOS word line (WLS) voltage, the drain is coupled for receiving a bit line (BL) voltage and the source is coupled for receiving a source line (SL) voltage. As shown in the cross-section of FIG. 3, the substrate or well of the SONOS transistor is coupled for receiving a well bias voltage (P-WELL).

Figure 2B:
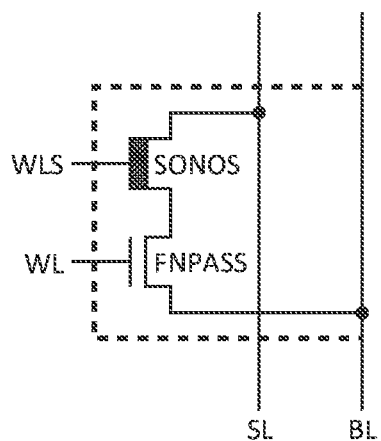
FIG. 2B is a circuit schematic depicting an embodiment of a 2T SONOS memory cell that may be included in the NV memory array of FIG. 1.

An embodiment of a 2T SONOS memory cell is illustrated in FIG. 2B. The 2T memory cell shown in FIG. 2B includes an N-type SONOS transistor and an N-type pass device (FN-PASS). The pass device may be included to minimize leakage currents during read operations. The SONOS gate is coupled for receiving the SONOS word line (WLS) voltage, while the source is coupled for receiving the source line (SL) voltage. The drain of the SONOS transistor is coupled to the source of the FNPASS device. The gate of the FNPASS device is coupled for receiving the word line (WL) voltage, while the drain is coupled for receiving the bit line (BL) voltage. The SONOS and FNPASS devices share a common substrate connection. Like the 1T cell, a well bias voltage (P-WELL) is supplied to the substrate of the SONOS and FNPASS devices to facilitate read, erase and program operations. Exemplary voltages for reading, erasing and programming a 2T SONOS memory cell are shown in FIG. 5-9 and discussed in more detail below.

Figure 3:
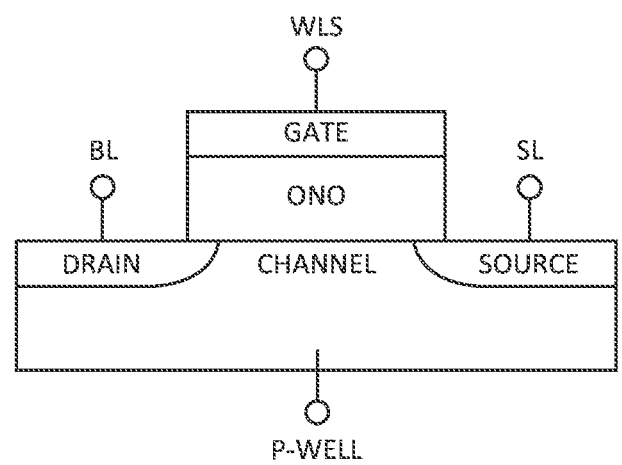
FIG. 3 is a cross-section depicting an embodiment of an N-type SONOS transistor included within a SONOS memory cell.

FIG. 3 is a cross-section illustrating an embodiment of an N-type SONOS transistor. Although N-type devices are illustrated, the memory architecture described herein is not so limited and may include P-type devices in other embodiments. A skilled artisan would understand how the memory architecture could be modified to accommodate such devices.

As shown in FIG. 3, the gate of the SONOS transistor is separated from the channel by a stack of dielectric layers. The dielectric stack (often referred to as an "ONO stack") may include a thin tunneling layer (typically, an oxide) above the channel, a charge-trapping layer (typically, a nitride) above the tunneling layer, and a blocking layer (typically, an oxide) between the charge-trapping layer and the gate. The charge trapping layer of the SONOS transistor is the storage node for the 1T and 2T memory cells shown, e.g., in FIGS. 2A and 2B. As described below, the charge trapping layer may be "charged" to alter the threshold voltage (VT) of the SONOS transistor and change the value of the bit stored within the 1T or 2T memory cell (e.g., to a "0" or "1"). The threshold voltage (VT) is defined as the threshold gate-source voltage for current to flow through the SONOS transistor. The connection to BL and SL corresponds to the 1T cell FIG. 2A A SONOS memory cell is programmed or erased by applying a voltage of the proper polarity, magnitude and duration between the gate terminal and the source/drain/substrate terminals of the SONOS transistor. This voltage is referred to as the gate-to-channel voltage. For example, a SONOS memory cell is programmed by raising the gate-to-channel voltage of the SONOS transistor to a relatively high positive value (typically between 8V and 12V). As a result, electrons tunnel from the channel to the ONO stack, where they become trapped in the charge trapping nitride layer. The trapped charge produces an energy barrier between the transistor drain and source, which raises the threshold voltage (VT) of the SONOS transistor. In one embodiment, a "1" bit may be stored within the memory cell by raising the threshold voltage of a programmed SONOS transistor to a substantially positive VT. The electrons trapped within the nitride layer are removed by applying a negative gate-to-channel voltage (typically between −8V and −12V) to the SONOS transistor, thereby lowering the threshold voltage of the SONOS transistor and erasing the contents of the memory cell. In one embodiment, an erased SONOS transistor with a substantially negative VT may be used to store a "0" bit within the memory cell. Once programmed or erased, the contents of the SONOS memory cell are read by applying nominal voltages to a particular combination of word, bit and source lines, and sensing whether or not current is flowing on the corresponding bit line. Accordingly, the SONOS transistor receives voltages (e.g., a positive voltage (VPOS), a negative voltage (VNEG), and a voltage from a power supply (vpwr) or ground (vgnd)) to achieve the operation modes mentioned above.

Figure 4:
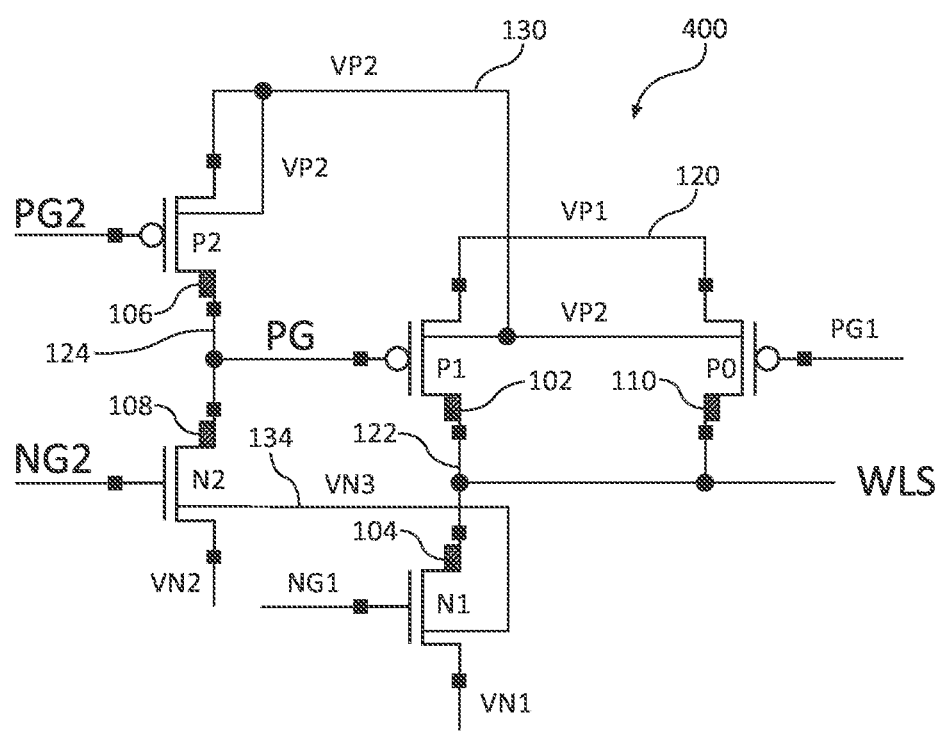
FIG. 4 is a block schematic diagram of an embodiment of a row driver circuit, according to another embodiment.

FIG. 4 is a schematic of a row driver circuit 400 configured to drive a WLS for the programming, erasing, and reading of a memory cell of the array 110. The row driver circuit 400 includes five transistors P0, P1, P2, N1, and N2 each having extended drain devices 110, 102, 106, 104, 108, respectively. In an embodiment, the sources of transistors P0 and P1 are connected in parallel through node 120, the extended drain 102 of transistor P1 is coupled through node 122 to the extended drain 104 of transistor N1 and is connected to the SONOS wordline (WLS)). The extended drain 106 of transistor P2 is coupled through node 124 to the extended drain 108 of transistor N2, and is connected to the gate of transistor P1. Line 130 indicates the connection of the P-wells of each of transistor P0, P1, and P2 to a common bulk, while line 134 connects to a common bulk of transistor N1 and N2.

Each transistor receives a gate voltage. In particular, transistor P0 receives a first gate voltage PG1, transistor N1 receives a second gate voltage NG1, transistor P2 receives a third gate voltage PG2, and transistor N2 receives a fourth gate voltage NG2. Transistor P1 also receives an internally generated gate voltage PG.

Each transistor receives a voltage bias for the various operating modes of the SONOS memory cells. For example, transistors P0 and P1 receive bias signals and are supplied by a first voltage bias VP1. Transistor N1 is supplied by a second voltage bias (VN1). Transistor P2 receives signals for a third voltage bias (VP2), and the Transistor N2 receives signals for a fourth voltage bias (VN2). In an embodiment, a bridge couples Transistor N1 to N2, and the bridge receives a fifth voltage bias (VN3). The bias signals are externally generated and based on their polarity either VN1 or VP1 are propagated to the output WLS.

As mentioned briefly above, one or more of the transistors comprise extended drain devices. As a result, more voltage can be supported on one of the junctions (e.g., drain-gate and drain-source) when the device is turned off. In an embodiment, one or more of the transistors P0, P1, P2, N1, or N2 comprises an extended drain device capable of supported up to about 5V. In another embodiment, one or more of the transistors P0, P1, P2, N1, or N2 comprises an extended drain device capable of supported up to about 9V. In accordance with another embodiment, transistor N2 includes a 5V extended drain device, and the remaining transistors P0, P1, P2, and N1 include 9V extended drain devices. In other embodiments, one or more of the transistors includes cascoded devices biased to protect the circuit from overvoltage stresses.

FIG. 5 is a table of a bias voltage scheme for the row driver circuit 400 for erasing SONOS memory cells, according to an embodiment. From left to right, the table includes a first column listing each gate voltage and voltage bias to be applied to the circuit 400, a second column "sel row" corresponding to an active row (selected) on which an erase operation is performed and a third column "desel row" corresponding to a de-select bias which is applied to the inactive (deselected) rows in the selected sector.

In some embodiments, the non-volatile memory array is partitioned into multiple "blocks" and/or multiple "sectors." In such case, the select and de-select biases shown in second and third columns are applied to enable or select block(s) or sector(s). The table further includes a fourth column including de-select biases which are applied to the deselected block(s) or sector(s). If the memory array is not partitioned into blocks or sectors, the select and de-select biases shown in the second and third columns are applied to the entire memory array.

As shown in FIG. 5, to erase a selected row in a selected sector, the output WLS from transistor P0 is biased to VNEG (for the selected row). To keep one or more of the deselected rows from being erased, the output WLS is biased to VPOS (for the de-selected rows in a selected sector). The received gate voltage PG1 is biased to VPOS (for the selected row) and vpwr (for the de-selected rows), gate voltage NG1 to transistor N1 is biased to 0 (e.g., ground or vgnd) (for the selected row) and VNEG (for the de-selected rows), gate voltage PG2 to transistor P2 is biased to vpwr in both cases, and gate voltage NG2 to transistor N2 is biased to 0 in both cases. Voltage biases VP1 and VP2 for the selected sector are maintained at VPOS, voltage biases VN1 and VN3 are maintained at VNEG, and voltage bias VN2 is biased to ground. For the deselected sector(s) during the erase mode, WLS, VP1, and VP2 are biased to vpwr, PG1, PG2, NG1, NG2, VN1, and VN2 are biased to ground, and voltage bias VN3 is at VNEG.

FIG. 6 is a table of a bias voltage scheme for a row driver circuit for programming SONOS memory cells, according to an embodiment. FIG. 6 is similar to FIG. 5, except the bias value entries are specific to programming. Accordingly, to program a selected row in a selected sector, the output WLS from transistor P0 is biased to VPOS (for the selected row). To keep particular rows in the selected sector from being programmed, the output WLS is biased to VNEG (for the de-selected rows in the selected sector). The received gate voltage PG1 is biased to vpwr (for the selected row) or VPOS (for the de-selected rows), gate voltage NG1 to transistor N1 is biased to VNEG (for the selected row) or ground (for the de-selected rows), gate voltage PG2 to transistor P2 is biased to vpwr in both cases, and gate voltage NG2 to transistor N2 is biased to ground in both cases. Voltage biases VP1 and VP2 for the selected sector are biased to VPOS, voltage biases VN1 and VN3 are at VNEG, and voltage bias VN2 is biased to ground. For the de-selected sectors during the program mode, WLS, PG1, NG2, VN1, and VN2 are biased to ground, and PG1, NG1, VP1, and VP2 are at vpwr.

In addition to erase and programming modes, margin mode (MM) reads are conducted on the NV memory array 110. MM reads are similar to normal reads, except that the SONOS gate is driven to VMARG (instead of 0V or ground). As such, a gate-to-source voltage of VMARG is supplied to the SONOS device during margin mode reads. In an embodiment, a margin mode read of the memory array is initiated to determine if target VTE (SONOS erase VT) and target VTP (SONOS program VT) values are met during erase/program operations. For example, erased SONOS devices have mainly negative VTs (called VTEs) and programmed SONOS devices have mainly positive VTs (called VTPs). In some cases, a negative margin mode read may be initiated to determine if a target VTE that avoids over-erasure has been met. A positive margin mode read may be initiated to determine if a target VTP has been met.

FIG. 7 is a table of a bias voltage scheme for a row driver circuit for performing a positive margin mode read on SONOS memory cells, according to an embodiment. FIG. 7 is similar to FIGS. 5 and 6, except the bias value entries are specific to the positive margin mode read. Accordingly, for a positive margin mode read for a selected row in a selected sector the output WLS from transistor P0 is biased to VMARG (for the selected row). For the unselected rows in the selected sector, the WLS output is biased at ground. The received gate voltage PG1 is biased to ground (for the selected row) and VPOS (for the de-selected rows), gate voltage NG1 to transistor N1 is biased to ground (for the selected row) and vpwr (for the de-selected rows), gate voltage PG2 to transistor P2 is biased to VPOS (for the selected row) and ground (for the de-selected rows), and gate voltage NG2 to transistor N2 is biased to vpwr (for the selected row) and −VTP (for the de-selected rows). For the selected sector voltage biases, VP1 is biased to VMARG, voltage bias VP2 is biased to VPOS, voltage bias VN1 is biased to ground, and voltage biases VN2 and VN3 are biased to −VTP. For the de-selected sector during the positive margin mode, WLS, PG2, NG2, VN1, and VN2 are biased to ground, PG1, NG1, VP1, and VP2 are maintained at vpwr, and VN3 is biased to −VTP.

In an embodiment, in the positive margin mode, VMARG includes a bias range of 0V to +2.5V. VMARG is passed onto the WLS output signal. The control of the PG gate signal, mentioned previously as being an internally-generated gate voltage, is accomplished by the VTP signal, which is set at less than VMARG present at the source of P0. Thus, when 0<VMARG<1.25 (i.e., the most significant bit for the Margin Mode DAC (MDAC MSB)=0), then VN2=PG=VTP=−1.8V and Gate Oxide voltage (VGOX)<3.63 and |Gate to Source Voltage (VGS)|>Vth. The term VGOX refers to the maximum voltage which can be applied across the terminals of a device without damaging the device. However, when VMARG approaches +2.5V GOX stress becomes a concern. To minimize gate oxide stress, VTP is switched to 0V and VN2=PG=0V to allow VGOX <3.63 and |VGS|>Vth. By making the biases dependent on VMARG, P0 is ON and protected from voltage stresses across the entire bias range of 0V to +2.5V.

FIG. 8 is a table of a bias voltage scheme for a row driver circuit for performing a negative margin mode read on SONOS memory cells, according to an embodiment. FIG. 8 is similar to FIG. 7, except the bias value entries are specific to the negative margin mode read. Accordingly, for the negative margin mode read for a selected row in a selected sector the output WLS from transistor P0 is biased to VMARG (for the selected row). For the de-selected rows in the selected sector the WLS output is biased at ground. The received gate voltage PG1 is biased to vpwr (for the selected row) and ground (for the de-selected rows), gate voltage NG1 to transistor N1 is biased to vpwr (for the selected row) and VNEG (for the de-selected rows), gate voltage PG2 to transistor P2 is biased to ground (for the selected row) and vpwr (for the de-selected rows), and gate voltage NG2 to transistor N2 is biased to VNEG (for the selected row) and ground (for the de-selected rows). Voltage biases VP1 for the selected sector is biased to ground, voltage bias VP2 is biased to vpwr, voltage bias VN1 is biased to VMARG, and voltage biases VN2 and VN3 are biased to VNEG. For the de-selected sector(s) during the positive margin mode, WLS, VP1, VN1, and VN2 are biased to ground, PG1, PG2, NG1, NG2, and VP2 are maintained at vpwr, and VN3 is biased to VNEG.

For the negative margin mode, VMARG includes a bias range of −2.5V to 0V.

FIG. 9 is a table of a bias voltage scheme for a row driver circuit for performing a read operation. To read all sectors and rows, WLS, PG2, VN1, VN2, and VN3 are biased to ground, and PG1, NG1, NG2, VP1, and VP2 are biased to vpwr. A low voltage (LV) circuit drives the pass transistor during the read operation.

Although encoded HV signals are described above, it will be understood that one or more of the encoded HV signals could be replaced with simple HV signals in other embodiments. In such case, larger multiplexers and additional biasing circuits are employed in the NV memory architecture for selecting the simple HV signals resulting in a larger silicon area.

By employing the bias voltage schemes described above for each mode of operation, HV functionality is achieved. Additionally, HV GOX circuit reliability is maintained while minimizing die size. In particular, using the above described devices and schemes avoids the use of a very thick oxide (e.g., 80-90A) for supporting the sum of the high voltages VPOS and VNEG. As a result, the aforementioned devices and schemes minimize manufacturing costs and simplify device design. Moreover, use of extended drain devices to drive HV with VGS reduction circuitry allows the circuit to withstand the high voltages across drain to gate or drain to source and to reduce the electric field across a gate oxide to a safe level.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method of operating a circuit to provide a word line output (WLS) comprising:
    supplying a first gate voltage (PG1) at a first voltage bias (VP1) to a source of a first transistor providing the output (WLS);
    providing the first voltage bias (VP1) to a second transistor and supplying a second voltage bias (VN1) and a second gate voltage (NG1) to a third transistor, the second transistor coupled in series to the third transistor and in parallel with the first transistor;
    supplying a third voltage bias (VP2) and a third gate voltage (PG2) to a fourth transistor, and a fourth voltage bias (VN2) and a fourth gate voltage (NG2) to a fifth transistor, the fourth transistor coupled in series to the fifth transistor, and the fourth and fifth transistors coupled to a gate of the second transistor; and
    providing a fifth voltage bias (VN3) to a line connecting a first n-well of the third transistor to a second n-well of the fifth transistor.

2. The method of claim 1, further comprising selectively providing the circuit with a positive voltage (VPOS), a negative voltage (VNEG), one or more biases between VPOS and VNEG, a power supply voltage (vpwr), and a ground supply (vgnd).

3. The method of claim 2, further comprising operating the circuit in an erase mode in a selected sector having rows to be selected and de-selected such that:
    the output (WLS) is biased to VNEG for a selected row of the selected sector and VPOS for a de-selected row of the selected sector;
    the first gate voltage (PG1) is biased to VPOS for the selected row and vpwr at the de-selected row;
    the second gate voltage (NG1) is biased to 0 for the selected row and VNEG at the de-selected row;
    the third gate voltage (PG2) is biased to vpwr for the selected row and the de-selected row;
    the fourth gate voltage (NG2) is biased to 0 for the selected row and the de-selected row;
    the first voltage bias (VP1) and the third voltage bias (VP2) are biased to VPOS for the selected row and the de-selected row;
    the second voltage bias (VN1) and the fifth voltage bias (VN3) are biased to VNEG for the selected row and the de-selected row; and
    the fourth voltage bias (VN2) is biased to 0 for the selected row and the de-selected row.

4. The method of claim 3, further comprising operating the circuit in the erase mode for a de-selected sector such that:
    the output (WLS), the first voltage bias (VP1), and the third voltage bias (VP2) are biased to vpwr;
    the first gate voltage (PG1), the second gate voltage (NG1), the third gate voltage (PG2), the fourth gate voltage (NG2), the second voltage bias (VN1), and the fourth voltage bias (VN2) are biased to 0; and
    the fifth voltage bias (VN3) is biased to VNEG.

5. The method of claim 2, further comprising operating the circuit in a program mode in a selected sector having rows to be selected and de-selected such that:
    the output (WLS) is biased to VPOS for a selected row and VNEG for a de-selected row;
    the first gate voltage (PG1) is biased to vpwr for the selected row and VPOS for the de-selected row;
    the second gate voltage (NG1) is biased to VNEG for the selected row and to 0 for the de-selected row;
    the third gate voltage (PG2) is biased to vpwr for the selected row and the de-selected row;
    the fourth gate voltage (NG2) is biased to 0 for the selected row and the de-selected row;
    the first voltage bias (VP1) and the third voltage bias (VP2) are biased to VPOS for the selected row and the de-selected row;
    the second voltage bias (VN1) and the fifth voltage bias (VN3) are biased to VNEG for the selected row and the de-selected row; and
    the fourth voltage bias (VN2) is biased at 0 for the selected row and the de-selected row.

6. The method of claim 5, further comprising operating in the program mode for a de-selected sector such that:

the output (WLS), the third gate voltage (PG2), the fourth gate voltage (NG2), the second voltage bias (VN1), the fourth voltage bias (VN2), and the fifth voltage bias (VN3) are biased to 0; and the first gate voltage (PG1), the second gate voltage (NG1), the first voltage bias (VP1), and the third voltage bias (VP2) are biased to vpwr.

7. The method of claim 2, further comprising:

selectively providing the circuit with a margin voltage (VMARG) and a negative bias voltage (−VTP); and operating the circuit in a positive margin mode in a selected sector having rows to be selected and de-selected such that:

the output (WLS) is biased to VMARG for a selected row and 0 for a de-selected row;

the first gate voltage (PG1) is biased to 0 for the selected row and VPOS for the de-selected row;

the second gate voltage (NG1) is biased to 0 for the selected row and vpwr for the de-selected row;

the third gate voltage (PG2) is biased to VPOS for the selected row and 0 for the de-selected rows;

the fourth gate voltage (NG2) is biased to vpwr for the selected row and −VTP for the de-selected row;

the first voltage bias (VP1) is biased to VMARG for the selected row and the de-selected row;

the third voltage bias (VP2) is biased to VPOS for the selected row and the de-selected rows;

the second voltage bias (VN1) is biased to 0 for the selected row and de-selected row;

the fifth voltage bias (VN3) is biased to −VTP for the selected row and the de-selected row; and the fourth voltage bias (VN2) is selectively biased to −VTP or 0 for the selected row and the de-selected row depending on a value for the Most Significant Bit (MSB) set for the circuit generating VMARG.

8. The method of claim 7, further comprising operating the circuit in the positive margin mode for a de-selected sector such that:

the output (WLS), the third gate voltage (PG2), the fourth gate voltage (NG2), the second voltage bias (VN1), and the fourth voltage bias (VN2) are biased to 0;

the first gate voltage (PG1), the second gate voltage (NG1), the first voltage bias (VP1), and the third voltage bias (VP2) are biased to vpwr; and the fifth voltage bias (VN3) is biased to −VTP.

9. The method of claim 2, further comprising:

supplying a margin voltage (VMARG) to the circuit; and operating the circuit during a negative margin in a selected sector having rows to be selected and de-selected such that:

the output (WLS) is biased to VMARG for a selected row and 0 for a de-selected row;

the first gate voltage (PG1) is biased to vpwr for the selected row and 0 for the de-selected row;

the second gate voltage (NG1) is biased to vpwr for the selected row and VNEG for the de-selected row;

the third gate voltage (PG2) is biased to 0 for the selected row and vpwr for the de-selected row;

the fourth gate voltage (NG2) is biased to VNEG for the selected row and 0 for the de-selected row;

the first voltage bias (VP1) is biased to 0 for the selected row and the de-selected row;

the third voltage bias (VP2) is biased to vpwr for the selected row and the de-selected row;

the second voltage bias (VN1) is biased to VMARG for the selected row and the de-selected row; and the fourth voltage bias (VN2) and the fifth voltage bias (VN3) are biased to VNEG for the selected row and the de-selected row.

10. The method of claim 9, further comprising operating the circuit in the negative margin mode for a de-selected sector such that:

the output (WLS), the first voltage bias (VP1), the second voltage bias (VN1), and the fourth voltage bias (VN2) are biased to 0;

the first gate voltage (PG1), the second gate voltage (NG1), the third gate voltage (PG2), the fourth gate voltage (NG2), and the third voltage bias (VP2) are biased to vpwr; and the fifth voltage bias (VN3) is biased to VNEG.

11. The method of claim 2, further comprising operating the circuit in a read mode for all sectors and rows such that:

the output (WLS), the third gate voltage (PG2), the second voltage bias (VN1), the fourth voltage bias (VN2), and the fifth voltage bias (VN3) are biased to 0; and the first gate voltage (PG1), the second gate voltage (NG1), the fourth gate voltage (NG2), the first voltage bias (VP1), and the third voltage bias (VP2) are biased to vpwr.

12. The method of claim 1, wherein one or more of the first transistor, the second transistor, the third transistor, the fourth transistor, and the fifth transistor comprise extended drain transistors.

13. A high voltage row driver circuit comprising:

a first transistor configured to receive a first gate voltage (PG1), to be supplied by a first voltage bias (VP1), and to provide an output (WLS);

a first set of two transistors including a second transistor and a third transistor, the second transistor connected in parallel with the first transistor and configured to be supplied with the first voltage bias (VP1), and the third transistor connected to the second transistor and configured to be supplied with a second voltage bias (VN1) and to receive a second gate voltage (NG1);

a second set of two transistors connected to the first set of two transistors and including a fourth transistor connected to a fifth transistor, the fourth transistor configured to be supplied by a fourth voltage bias (VP2) and to receive a third gate voltage (PG2), and the fifth transistor configured to be supplied by fourth voltage bias (VN2) and to receive a fourth gate voltage (NG2); and a line connecting a first n-well of the third transistor to a second n-well of the fifth transistor supplied by a fifth voltage bias (VN3);

wherein:

one or more of the first transistor, the second transistor, the third transistor, the fourth transistor, and the fifth transistor comprise extended drain devices.

14. The high voltage row driver circuit of claim 13, wherein the first transistor, the second transistor, the third transistor, and the fourth transistor comprise 9V extended drain devices.

15. The high voltage row driver circuit of claim 14, wherein the fifth transistor comprises a 5V extended drain device.

16. The high voltage row driver circuit of claim 13, wherein during an erase mode of a selected sector having a plurality of rows to select and to de-select:

the output (WLS) is biased at VNEG for a selected row of the selected sector and VPOS for a de-selected row of the selected sector;

the first gate voltage (PG1) is biased to VPOS for the selected row and vpwr for a de-selected row;

the second gate voltage (NG1) is biased to 0 for the selected row and VNEG for a de-selected row;

the third gate voltage (PG2) is biased to vpwr for the selected row and the de-selected row; and the fourth gate voltage (NG2) is biased to 0 for the selected row and the de-selected row.

17. The high voltage row driver circuit of claim 13, wherein during a program mode of a selected sector having a plurality of rows to select and to de-select:

the output (WLS) is biased to VPOS for a selected row of the selected sector and VNEG for a de-selected row of the selected sector;

the first gate voltage (PG1) is biased to vpwr for the selected row and VPOS for the de-selected row;

the second gate voltage (NG1) is biased to VNEG for the selected row and 0 for the de-selected row;

the third gate voltage (PG2) is biased to vpwr for the selected row and the de-selected row; and the fourth gate voltage (NG2) is biased to 0 for the selected row and the de-selected row.

18. The high voltage row circuit of claim 13, further configured to receive a margin voltage (VMARG) and a negative bias voltage (−VTP) and wherein during a positive margin mode in a selected sector having a plurality of rows to select and to de-select:

the output (WLS) is biased to VMARG for a selected row of the selected sector and 0 for a de-selected row of the selected sector;

the first gate voltage (PG1) is biased to 0 for the selected row and VPOS for the de-selected row;

the second gate voltage (NG1) is biased to 0 for the selected row and vpwr for the de-selected row;

the third gate voltage (PG2) is biased to VPOS for the selected row and 0 for the de-selected row; and the fourth gate voltage (NG2) is biased to vpwr for the selected row and −VTP for the de-selected row.

19. The high voltage row circuit of claim 13, further configured to receive a margin voltage (VMARG) and wherein during a negative margin mode in a selected sector having a plurality of rows to select and to de-select:

the output (WLS) is biased to VMARG for a selected row of the selected sector and 0 for a de-selected row of the selected sector;

the first gate voltage (PG1) is biased to vpwr for the selected row and 0 for the de-selected row;

the second gate voltage (NG1) is biased to vpwr for the selected row and VNEG for the de-selected row;

the third gate voltage (PG2) is biased to 0 for the selected row and vpwr for the de-selected row; and the fourth gate voltage (NG2) is biased to VNEG for the selected row and 0 for the de-selected row.

20. A high voltage row driver circuit comprising:

a first transistor configured to receive a first gate voltage and having a first source and a first extended drain;

a first set of two transistors connected to the first transistor and including a second transistor and a third transistor, the second transistor having a second source and a second extended drain, the third transistor having a third extended drain, the second source of the second transistor connected in parallel with the first source of the first transistor, the second extended drain of the second transistor connected to the third extended drain of the third transistor, the second transistor configured to be biased by the first voltage bias, and the third transistor configured to be biased by a second voltage bias and to receive a second gate voltage; and a second set of two transistors connected to the first set of two transistors, the second set of two transistors including a fourth transistor and a fifth transistor, the fourth transistor having a fourth extended drain, the fifth transistor having a fifth extended drain, the fourth extended drain of the fourth transistor connected to the fifth extended drain of the fifth transistor, the fourth transistor configured to be biased by a fourth voltage bias and to receive a third gate voltage, and the fifth transistor configured to be biased by a fifth voltage bias and to receive a fourth gate voltage; and wherein:

the first transistor, the second transistor, and the fourth transistor share a common bulk; and the third transistor and the fifth transistor share another common bulk.

* * * * *